Figure 1:
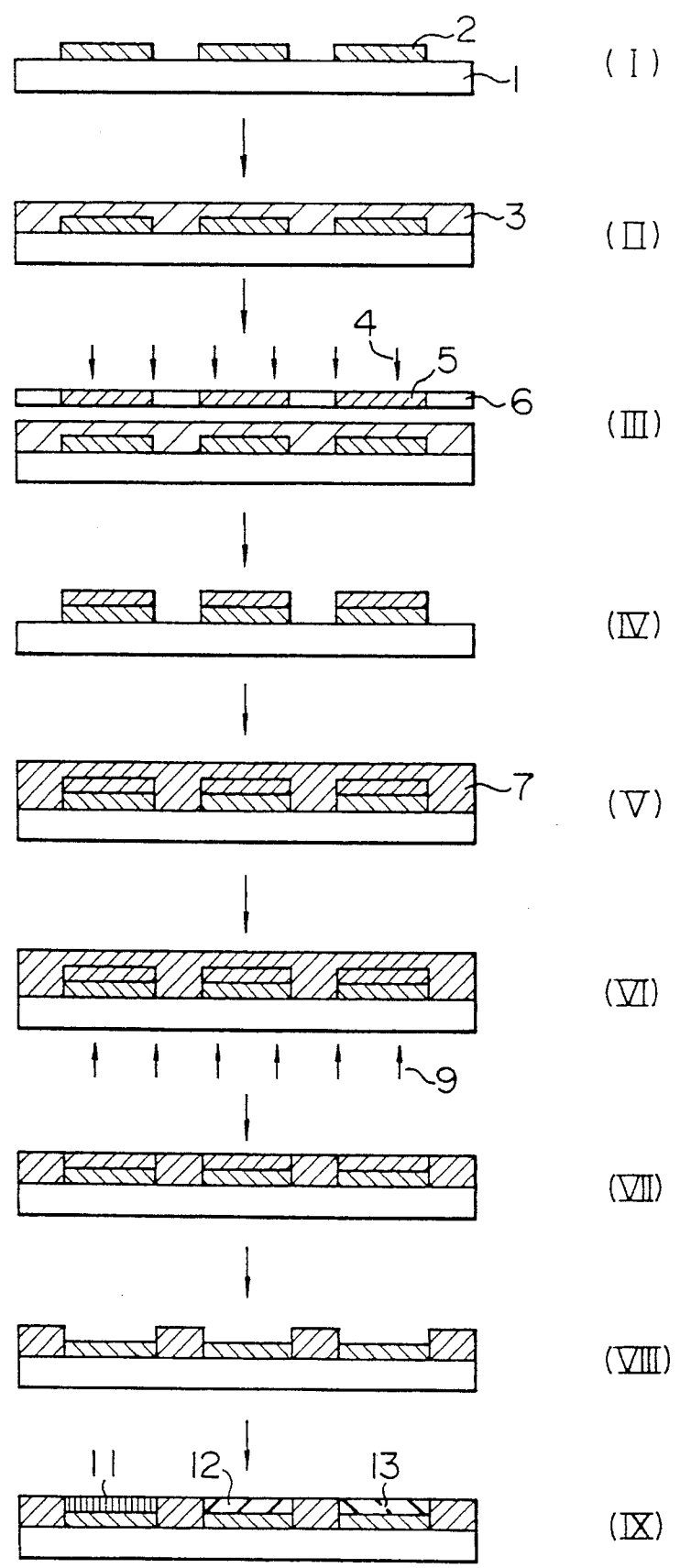

United States Patent [19]

Miyazaki et al.

[11] Patent Number: 5,561,011

[45] Date of Patent: Oct. 1, 1996

[54] METHOD FOR MANUFACTURING A SUBSTRATE HAVING WINDOW-SHAPED COATING FILMS AND FRAME-SHAPED COATING FILM ON THE SURFACE THEREOF

[75] Inventors: Susumu Miyazaki, Ibaraki-ken; Tsuyoshi Nakano, Funabashi; Yoshikatsu Okada, Chiba; Jun-ichi Yasukawa, Chigasaki; Miki Matsumura, Tokyo; Kazuo Tsueda, Narashino, all of Japan

[73] Assignee: Shinto Paint Co., Ltd., Amagasaki, Japan

[21] Appl. No.: 292,962

[22] Filed: Aug. 22, 1994

[30] Foreign Application Priority Data

Sep. 17, 1993 [JP] Japan .................................. 5-231370

[51] Int. Cl.$^6$ .................................................. G03F 9/00
[52] U.S. Cl. .............................. 430/7; 430/312; 430/315; 430/394; 430/324; 430/293
[58] Field of Search ........................ 430/7, 324, 293, 430/20, 394, 312, 315

[56] References Cited

U.S. PATENT DOCUMENTS 4,311,773  1/1982  Kaneko et al. ............................ 430/7
4,617,094  10/1986  Kamamori et al. ...................... 430/321

(List continued on next page.)

FOREIGN PATENT DOCUMENTS 2-61601  3/1990  Japan .

OTHER PUBLICATIONS

*Patent Abstracts Of Japan*, vol. 12, No. 388 (P–771), 17 Oct. 1988 & JP-A-63 131 127 (Seiko Instru & Electronics), 3 Jun. 1988.

(List continued on next page.)

*Primary Examiner*—George F. Lesmes
*Assistant Examiner*—Laura Weiner
*Attorney, Agent, or Firm*—Watson Cole Stevens Davis, P.L.L.C.

[57] ABSTRACT

A method for manufacturing a substrate having electrically conductive circuits on the surface of a transparent substrate, window-shaped coating films on the electrically conductive circuits and a frame-shaped, functional coating film at the regions not occupied with the window-shaped coating films, includes the steps of:

(a) coating the surface of a transparent substrate with a photoresist composition to cover the circuits-carrying surface of the substrate, followed by forming a photoresist coating film, (b) superposing a photomask on the surface of the photoresist coating film formed through step (a) and exposing the thus masked photoresist coating film to light, (c) subjecting the substrate formed through steps (a) and (b) to development, and eliminating the photoresist coating film in the frame-shaped part, (d) subjecting the photoresist coating film left in step (c) to heat-treatment, (e) coating the substrate obtained through steps (a) to (d) in this order with a negative photoresist composition containing a function-imparting additive to cover the circuits-carrying surface of the substrate, followed by forming a functional coating film, (f) exposing the substrate obtained through steps (a) to (e) in this order to light emitted from the opposite side of the circuits-carrying surface of the substrate, (g) subjecting the substrate obtained through steps (a) through (f) in this order to development, and eliminating the uncured part of the functional coating film, (h) eliminating the photoresist coating film having been heat-treated in step (d), and (i) subjecting the substrate obtained through steps (a) to (h) in this order to electro-deposition using the circuits on the substrate as one electrode, and forming electro-deposition coating films at the window-shaped parts on the circuits.

13 Claims, 3 Drawing Sheets

U.S. PATENT DOCUMENTS

| | | | |
|---|---|---|---|
| 4,767,723 | 8/1988 | Hinsberg, III et al. | 437/41 |
| 4,812,387 | 3/1989 | Suzuki et al. | 430/311 |
| 4,873,175 | 10/1989 | Suzuki et al. | 430/311 |
| 4,902,592 | 2/1990 | Matsumura et al. | 430/7 |
| 4,948,706 | 8/1990 | Sugihara et al. | 430/312 |
| 5,121,237 | 6/1992 | Ikeda et al. | 359/67 |

OTHER PUBLICATIONS

*Patent Abstracts Of Japan,* vol. 14, No. 240 (P–1051), 22 May 1990 & JP–A–02–061 601 (Seiko Instr Inc), 1 Mar. 1990.

*Patent Abstracts Of Japan,* vol. 13, No. 403 (P–929), 7 Sep. 1989 & JP–A–01 145 626 (Seiko Instr & Electron Ltd), 7 Jun. 1989.

METHOD FOR MANUFACTURING A SUBSTRATE HAVING WINDOW-SHAPED COATING FILMS AND FRAME-SHAPED COATING FILM ON THE SURFACE THEREOF

The present invention relates to a method for manufacturing a substrate having on the surface thereof window-shaped coating films and a frame-shaped, functional coating film having functions of screening unnecessary light and achieving desirable properties. The method of the present invention is useful for producing a color filter used in a color liquid display (LCD), particularly a matrix type color liquid display formed using a thin layer transistor (TFT).

Liquid crystal displays have so far been used for goods with a small-sized display such as the so-called pocket-sized television. However, the size of liquid crystal displays has rapidly been enlarged in recent years. The image quality of liquid crystal displays has also been improved by the development from TN liquid crystals to STN liquid crystals and active driving elements exemplified by TFT, which has enabled the commercialization of goods with a liquid crystal display having as high image quality as cathode-ray tubes. Various studies have been conducted for improving the image quality and productivity of the color displays. Of these studies, the method for forming a light screening film called a black matrix that prevents light leakage toward TFT and improves the image quality and the shape of the light screening film are of great concern.

As the method for forming a frame-shaped, functional film (black matrix) at the regions not occupied with window-shaped colored coating films for the production of a color filter, there are known methods utilizing printing techniques such as silk screen method, offset method, etc. There is also known a method of forming a thin film of a metal such as chromium on a substrate by sputtering or the like and thereafter forming a black matrix by photo-lithography and etching. The study of a method of directly forming a black matrix by photo-lithography has been spurred by the recent development of negative photoresist compositions containing a black pigment. There is also known a method for forming a functional coating film as a black matrix in the gaps of stripe-form colored coating films, which comprises forming stripe-form colored coating films on a plurality of parallel strip-eform conductive circuits arranged on a transparent substrate by an electro-deposition method; coating a negative photoresist composition capable of giving a functional coating film on the whole surface of the substrate so as to cover the stripe-form colored coating films, followed by forming the photoresist film; exposing the photoresist-carrying surface of the substrate so that the stripe-form colored coating films function as a mask; and eliminating the uncured photo-resist film (JP-A-59-114572, JP-A-3-42602).

For TFT type liquid crystal displays which are considered promising in recent years, the improvement of light screening capacity of the light screening film is required in order to prevent light leakage toward a switching element. Also, for the sake of improvement in image quality, the light screening film has often become demanded to have a complicated pattern such as lattice form, etc.

A lattice-form, functional coating film may be formed by conventional methods utilizing printing techniques. However, they cannot provide a functional coating film of high precision, because the film formed has a coarse pattern in which the lattice gap is about 100 μm. According to the afore-mentioned method of directly forming a black matrix by photo-lithography using a black pigment-containing negative photoresist composition, the light-screening rate cannot be raised without lowering in photo-curing of the photoresist composition, so that a desired functional coating film cannot be formed with a high precision. Further, according to the method described in JP-A-59-114572 and JP-A-3-42602, it is difficult to form the functional coating film in the transverse direction of the stripe-form color coating films.

Thus, it is an object of the present invention to solve the above-mentioned problems of prior art by providing a method for manufacturing a substrate having window-shaped coating films and a frame-shaped, functional coating film having light-screening and desirable display properties at the regions not occupied with the window-shaped coating films particularly with high precision and a fine pattern such as a window width of less than about 200 μm.

Having taken notice that coating films can be formed only on conductive circuits selectively with high precision by the electro-deposition method, the present inventors have made extensive studies, and as a result, the present invention has been accomplished.

The present invention provides a method for manufacturing a substrate having electrically conductive circuits on the surface of a transparent substrate, window-shaped coating films on the electrically conductive circuits and a frame-shaped, functional coating film at the regions not occupied with the window-shaped coating films, which comprises the steps of:

(a) coating a transparent substrate having electrically conductive-circuits on the surface thereof with a positive or negative photoresist composition to cover the whole circuits-carrying surface of the substrate, followed by forming a photoresist coating film, (b) superposing, on the surface of the photoresist coating film formed through step (a), a photomask having a pattern designed so as to give in the following step (c) the photoresist coating film covering the regions other than the frame-shaped part, and exposing the thus masked photoresist coating film to light, (c) subjecting the substrate formed through steps (a) and (b) to development, and eliminating the photoresist coating film in the frame-shaped part, (d) subjecting the photoresist coating film left in step (c) to heat-treatment, (e) coating the substrate obtained through steps (a) to (d) in this order with a negative photoresist composition containing a function-imparting additive to cover the whole circuits-carrying surface of the substrate, followed by forming a functional coating film, (f) exposing the substrate obtained through steps (a) to (e) in this order to light emitted from the opposite side of the circuits-carrying surface of the substrate, (g) subjecting the substrate obtained through steps (a) to (f) in this order to development, and eliminating only the uncured part of the functional coating film which has not been sufficiently exposed to light due to the presence of the photoresist coating film having been heat-treated in step (d), (h) eliminating only the photoresist coating film having been heat-treated in step (d), and (i) subjecting the substrate obtained in steps (a) to (h) in this order to electro-deposition using the circuits on the substrate as one electrode, and forming electro-deposition coating films at the window-shaped parts on the circuits.

FIG. 1 is a cross-sectional schematic view illustrating the products formed through respective steps of the present invention.

In FIG. 1, (I) is a transparent substrate having a plurality of electrically conductive circuits; (II) is an intermediate product carrying a photoresist coating film formed through step (a); (III) is an intermediate product formed through step (b); (IV) is an intermediate product formed through steps (c) and (d); (V) is an intermediate product formed through step (e); (VI) is an intermediate product formed through step (f); (VII) is an intermediate product formed through step (g); (VIII) is an intermediate product formed through step (h); and (IX) is a final product formed through step (i).

Figure 2:
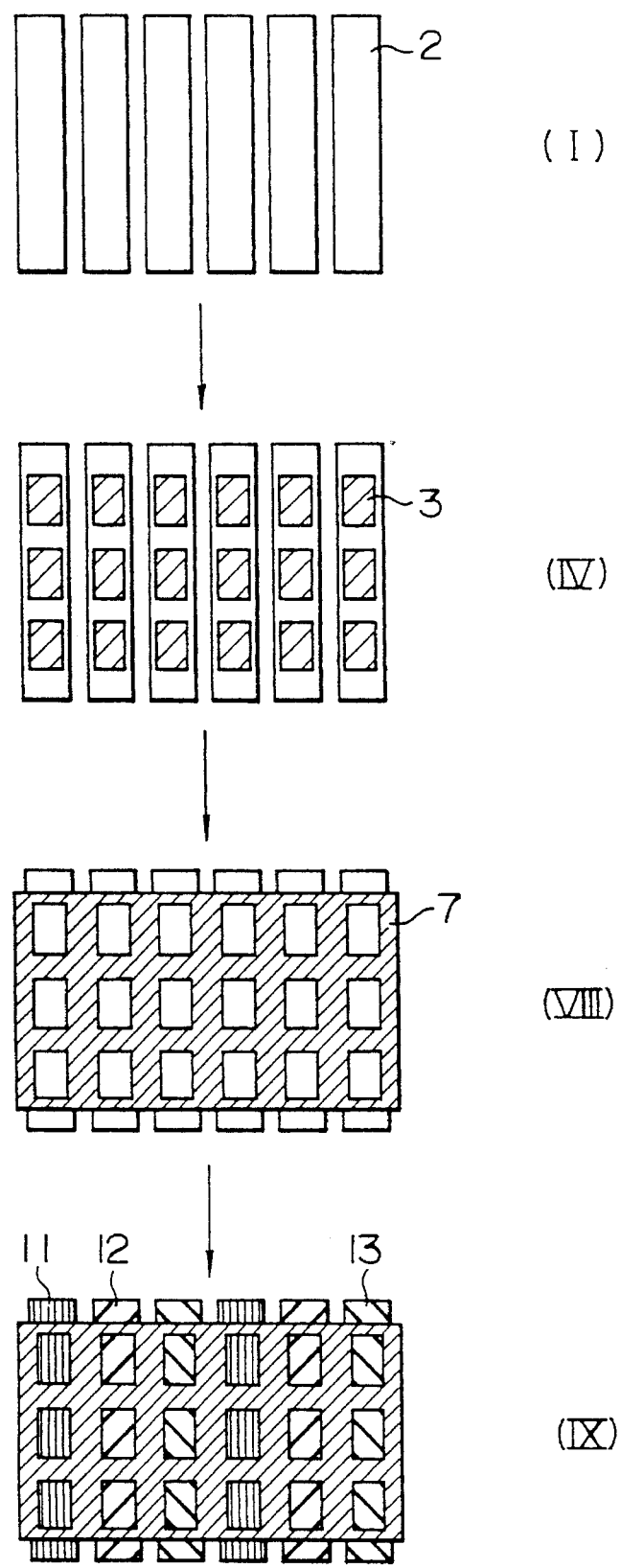

FIG. 2 is a schematic plan views exemplifying respective patterns of the conductive circuits, the frame-shaped functional coating film and the window-shaped coating films.

In FIG. 2, (I) exemplifies a pattern of the conductive circuits, (IV) a pattern of the window-shaped, photoresist coating films formed through steps (a), (b), (c) and (d), (VIII) a pattern of the frame-shaped, functional coating film formed through steps (e), (f), (q) and (h), and (IX) a pattern of the frame-shaped, functional coating film and the window-shaped, electro-deposited coating films formed through step (i).

Figure 3:
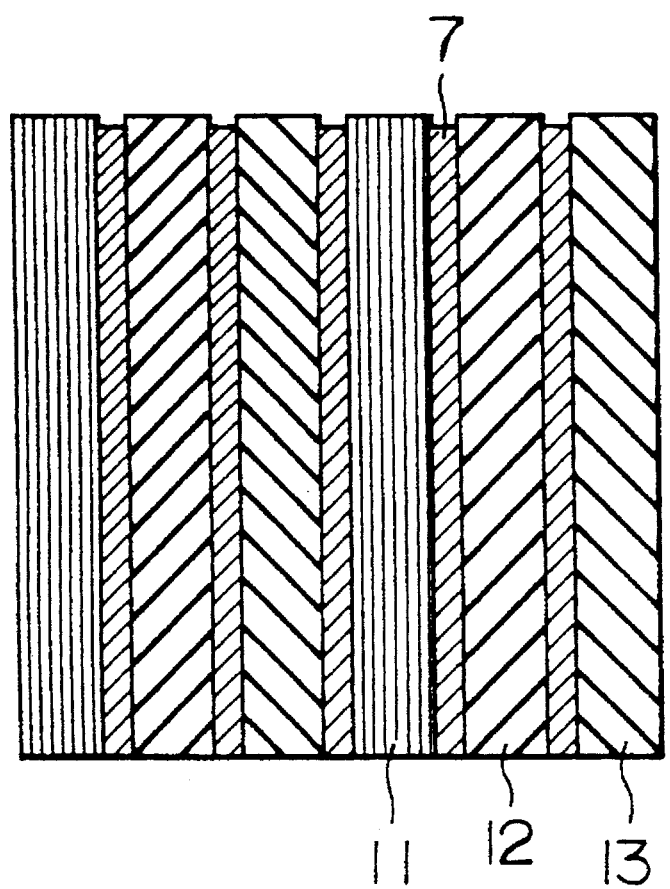

FIG. 3 is a schematic plan view exemplifying another example of the pattern of the window-shaped, electro-deposited coating films and frame-shaped, functional coating film obtained according to the present invention.

In FIGS. 1 to 3, 1 is a transparent substrate, 2 is an electrically conductive circuit, 3 is a photoresist coating film, 4 and 9 are beams of light, 5 is a light screening part of the photomask, 6 is a transparent part of the photomask, 7 is a functional coating film, 11 is an electro-deposition coating film (red) at the window-shaped parts, 12 is an electro-deposition coating film (green) at the window-shaped parts, and 13 is an electro-deposition coating film (blue) at the window-shaped parts.

The transparent substrate which can be used in the present invention include glass boards, plastic boards and the like. The electrically conductive circuit formed on the substrate are prepared from a transparent conductive material such as ITO film (tin-doped indium oxide film), NESA film (antimony-doped tin oxide film) and the like. The pattern of the electrically conductive circuits is usually a parallel arrangement of stripes. These stripes can be produced in a conventional manner.

In the present invention, the shapes of the window-shaped and frame-shaped parts may be arbitrarily selected. For example, as for the frame-shaped part, the lattice-form as shown in FIG. 2 and the parallel arrangement of a plurality of stripes as shown in FIG. 3 can be employed.

The method of the present invention is effective particularly for manufacture of a substrate having fine coating film patterns of which window-shaped parts each has a width of less than about 200 μm and preferably less than about 100 μm.

Step (a) of the present invention is a step of coating a transparent substrate having electrically conductive circuits on the surface thereof with a positive or negative photoresist composition to cover the whole circuits-carrying surface of the substrate, followed by forming a photoresist coating film.

Examples of the positive photoresist composition usable in step (a) include a composition containing a novolac type phenolic resin and an esterified product of o-quinonediazide, and the like. Commercially available positive photoresist compositions are OFPR-800 (trade name, manufactured by Tokyo Ohka Co., Ltd.), PF-7400 (trade name, manufactured by Sumitomo Chemical Co., Ltd., FH-2030 (trade name, manufactured by Fuji Hant Electronics Technology Co., Ltd.) , etc.

Examples of the negative photoresist composition usable in step (a) include a composition containing an acrylate resin and a photo-polymerization initiator such as benzophenone compounds, anthraquinone compounds and the like, etc. Commercially available negative photoresist compositions include OMR-83 (trade name, manufactured by Tokyo Ohka Co., Ltd.).

Into the positive or negative photoresist composition used herein, a light-screening ingredient such as carbon and the like may be incorporated, if desired. The incorporation of a light-screening ingredient can complement the light-screening capacity of the heat-treated photoresist coating films at the exposure to light of step (f). If the light-screening capacity is insufficient, the negative photoresist film (i.e. functional coating film) formed in step (f) remains lying on the photoresist films to bring about a disadvantageous result.

As a method for coating the positive or negative photoresist composition on the surface of the substrate having conductive circuits, screen printing method, offset printing method, roll coating method, bar coating method, spin coating method, etc. can be adopted. Among these, the spin coating method is recommendable because of high fidelity and high precision. In carrying out the spin coating, it is preferred to change the whirler in two stages in a manner such that the photoresist composition is spread on a substrate at 100–400 rpm in the first stage, and the thickness of the photoresist composition is made even at 800–5,000 rpm in the second stage.

The negative or positive photoresist composition coated on the substrate having conductive circuits is preferably heat-treated at 60°–100° C. for 5–60 minutes, thereby forming the photoresist coating film. By the heat-treatment, the resin in the negative or positive photoresist composition is preliminarily cured, and the adhesion of the photoresist coating film to the substrate having conductive circuits is improved.

Step (b) of the present invention is a step of superposing, on the surface of the photoresist coating film formed through step (a), a photomask having a pattern designed so as to give in the following step (c) the photoresist coating film covering the regions other than the frame-shaped part, and exposing the thus masked photoresist coating film to light.

In the exposure of step (b), lights of various wavelength ranges can be used depending on the kind of the negative or positive photoresist film. Generally speaking, lights of UV region are preferable. As the light source, apparatuses utilizing super-high pressure mercury lamp, metal halide lamp and the like can be used. From the viewpoint of accuracy of patterning, the apparatuses which have a mirror type of parallel light structure are preferred.

The conditions of exposure may vary depending on the light source and kind of photoresist film. In the case of positive photoresist film, the light exposure is usually in the range of 10–500 mJ/cm$^2$. In the regions exposed to light, a decomposition reaction progresses, whereby the resist becomes soluble in the developing solutions mentioned later. In the case of negative photoresist film, the light exposure is usually in the range of 10–500 mJ/cm$^2$, although the conditions of exposure may vary depending on the light source and kind of photoresist film. In the regions not exposed to light, no curing reaction progresses, so that such regions remain soluble in the developing solution mentioned later.

Step (c) of the present invention is a step of subjecting the substrate formed through steps (a) and (b) to development, and eliminating the photoresist coating film in the frame-shaped part.

In the case of the film formed using the positive photoresist film, the exposed portion is dissolved and eliminated. The elimination of exposed portion can be carried out using a developing agent. The agent may be selected from various ones depending on the kind of positive photoresist composition used. Examples thereof are aqueous alkaline solution of caustic soda, sodium carbonate, quaternary ammonium salt, organic amine and the like, and organic solvents such as esters, ketones, alcohols, aromatic hydrocarbons, chlorinated hydrocarbons, and the like. The elimination can be effected by dipping or showering the substrate in or with the developing agent in a period of from 5 seconds to about 3 minutes. Subsequently, the resulting substrate is thoroughly rinsed with city water, deionized water, or the like.

In the case of the film formed using the negative photoresist composition, the unexposed portion, i.e. uncured portion is eliminated. The elimination of unexposed portion can be effected in a developing manner similar to that mentioned above. Through these steps, the photoresist coating film can be formed in a desired shape depending on the photomask pattern used in step (b). FIG. 2 and FIG. 3 illustrate examples of the pattern shape of the photoresist coating film formed herein.

Step (d) of the present invention is a step of subjecting the photoresist coating film left in step (c) to heat-treatment. The heat-treatment is preferably carried out at 120°–300° C. for 15 minutes to 2 hours, and more preferably at 200°–260° C. for about one hour.

By the heat treatment, the reaction between the photoresist coating film and the functional coating film (i.e. the negative photoresist film) formed in the next step (e) can be suppressed, so that no photoresist coating film remains uneliminated around the functional coating film after the elimination procedure in step (h). Moreover, the elimination of the photoresist coating film in step (h) can be facilitated. Furthermore, a light transmittance of the photoresist coating film can be effectively reduced, so that the functional coating film formed on the photoresist coating film in the next step (e) remains uncured even after the light exposure in the following step (f) and can be easily eliminated by development in the following step (g).

Step (e) of the present invention is a step of coating the substrate obtained through steps (a) to (d) in this order with a negative photoresist composition containing a function-imparting additive to cover the whole circuits-carrying surface of the substrate, followed by forming a functional coating film.

The coating can be carried out by a method capable of giving a uniform coating film, such as spin coating method, roll coating method, screen printing method, offset printing method, dip coating method and the like. Preferred negative photoresist compositions include the so-called UV-curable photoresist composition. The main ingredient thereof includes, for example, acryl, urethane or epoxy resin, synthetic rubber, polyvinyl alcohol, gums or gelatin. These ingredients may be used either singly or in the form of mixture. The compositions thus prepared are commercially available as photo-curable paints, inks and negative resist. Into these materials, a reactive diluent, a reaction initiator, a photo sensitizer and the like may optionally be incorporated.

In the present invention, the negative photoresist composition contains a function-imparting additive such as known light-screening pigments or light-screening agents. When a function of adhesion is required, an appropriate adhesion-improving material may be added as the function-imparting additive. In coating the negative photoresist composition, the composition may be diluted to an appropriate viscosity or an appropriate solid content in order to improve the workability, by the use of an appropriate organic solvent in the case of organic solvent-dilution type compositions or by the use of water in the case of water-dilution type compositions.

After coating the negative photoresist composition, the substrate may be heat-treated at 60°–120° C. for 1 to 30 minutes in order to facilitate the formation of a functional coating film.

Step (f) of the present invention is a step of exposing the substrate obtained through steps (a) to (e) in this order to light emitted from the opposite side of the circuits-carrying surface of the substrate. For the exposure, light of various wavelength ranges can be used depending on the kind of negative photoresist. Generally speaking, light of the UV region are preferred. As the light source, apparatuses using super-high pressure mercury lamp, metal halide lamp or the like can be used. Although the conditions of exposure vary depending on the light source and the kind of negative photoresist, the light exposure is usually within the range of 100–2,000 mJ/cm$^2$. In the area exposed to light, a cross-linking reaction progresses whereby the functional coating film becomes insoluble and cures.

Step (g) of the present invention is a step of subjecting the substrate obtained through steps (a) to (f) in this order to development, eliminating only the uncured part of the functional coating film which has not been sufficiently exposed to light due to the presence of the photoresist coating film, the light transmittance of which has reduced by the heat-treatment in step (d).

The elimination is carried out using an appropriate developing agent, and thereby dissolving out the uncured parts of the functional coating film. The agent is appropriately selected in accordance with the kind of negative photoresist film. Examples thereof are aqueous alkaline solution of caustic soda, sodium carbonate, quaternary ammonium salt, organic amines or the like and organic solvent such as esters, ketones, alcohols, chlorinated hydrocarbons and the like. The dissolution of the uncured, functional coating film may be carried out by the method of dipping or showering the substrate in or with the agent for a time period of 30 seconds to about 5 minutes. Thereafter, the thus treated substrate is thoroughly washed with water, organic solvents or the like. Subsequently, the washed substrate may optionally be heat-treated at 100°–280° C. for a period of 10–120 minutes. By this step, a desired functional coating film is formed in the frame-shaped part.

Step (h) of the present invention is a step of eliminating only the photoresist coating film formed at the regions other than the frame-shaped part, and heat-treated in step (d). The elimination is carried out using an appropriate stripping agent. The agent is appropriately selected in accordance with the kind of the photoresist coating film. Examples thereof are aqueous alkaline solution of caustic soda, sodium carbonate, quaternary ammonium salt, organic amine or the like and an organic solvent such as esters, ketones, alcohols, ethers, chlorinated hydrocarbons and the like. The elimination of the photoresist coating film may be carried out by the method of dipping or showering the substrate in or with the agent for a period of 30 seconds to about 20 minutes. A rubbing means such as brush, woven fabric and the like may be used. Thereafter, the left film is thoroughly rinsed with organic solvent or water and, if desired, post-baked for the sake of eliminating water on the film.

Step (i) of the present invention is a step of subjecting the substrate obtained through steps (a) to (h) in this order to electro-deposition using the circuits on the substrate as one electrode, and forming electro-deposition coating films which may be colored at the window-shaped parts on the circuits.

At the time when step (h) has been completed, there are no coating films at the window-shaped parts on the conductive circuits. In step (i), a coating film is formed by the electro-deposition method at these window-shaped parts. The methods of electro-deposition on this sort of conductive circuits are generally well known. For example, the methods mentioned in Jitsumu Hyomen Gijutsu (Metal Finishing Practice), Vol. 34, No. 6 (1987), p. 57–63 and JP-B-4-64875 can be referred to. This method includes cationic and anionic coating methods, and any of these methods may be adopted in the present invention. However, anionic coating method is preferable to the cationic method because of smaller influence on the circuits. A resin material (binder) used in the electro-deposition includes, for example, maleinated oil type, acrylic type, polyester type, polybutadiene type and polyolefin type resin materials. These resin materials may be used either singly or in the form of mixture. Into the binder, a pigment and the like may be incorporated. An electro-depositing solution is usually prepared by dispersing a binder and other ingredients in water and diluting the resulting dispersion. As the electro-depositing solution, not only aqueous electro-depositing solutions but also non-aqueous electro-depositing solutions using organic solvents are usable.

A transparent substrate formed through the above-mentioned steps (a) to (h) is introduced into a bath containing the electro-depositing solution. In the case of anionic electro-deposition, the conductive circuits on the substrate are used as positive electrode, and a corrosion-resistant, electrically conductive material (e.g. stainless steel or the like) is used as a counter electrode, and then a direct current voltage is applied. Thus, electro-deposition coating films are selectively formed in the window-shaped parts located on the conductive circuits. The thickness of the electro-deposition coating films can be controlled by changing the conditions of electro-deposition. Usually, the period of the electro-deposition is from 1 second to about 3 minutes at a voltage of 10–300 V. After formation of electro-deposition coating films, the coating films are thoroughly washed to remove unnecessary substances therefrom. If desired, the coating films are heat-treated at 100°–280° C. for 10–120 minutes in order to enhance their strength.

In producing a color filter for use in LCD or the like, window-shaped, colored electro-deposition coating film and a frame-shaped, functional film having a function of black matrix are formed on a transparent substrate having electrically conductive circuits on its surface by the method of the present invention, and subsequently an overcoat film (protecting film) is formed thereon as occasion demands. The material for the overcoat film includes, for example, epoxy type, polyimide type and acrylate type resins. The overcoat film is formed by applying such a resin by means of spin coater, roll coater or the like, and thereafter thermally baking the resin. On the overcoat film is formed a transparent conductive film for driving the liquid crystal, and a circuit pattern is optionally formed, whereby a desired color filter can be produced.

The present invention is explained in more detail with reference to the following example which is only illustrative.

EXAMPLE 1

(1) Formation of Stripe-Form, Transparent, Electrically Conductive Circuits on Transparent Substrate Stripe-form ITO circuits (sheet resistance: 15 Ω/□) each having a width of 80 μm were formed in parallel and linearly on a glass substrate having a thickness of 1.1 μmm, at intervals of 20 m (100 μm pitch).

(2) Formation of Positive Photoresist Film

A positive photoresist film having a film thickness of 1.5 μm was formed by adding 20 parts by weight of ethyl cellosolve acetate to 100 parts by weight of a positive photoresist composition (trade name: FH2030, manufactured by Fuji Hant Electronics Technology Co.) to obtain a mixture, coating the whole surface of the transparent substrate obtained in (1) with the mixture obtained above by spin coating method in two stages, namely first at 200 rpm/5 seconds and secondly at 1,000 rpm/20 seconds, and heat-treating the resulting coat at 90° C. for 30 minutes. This procedure illustrates step (a) of the present invention.

(3) Exposure to Light

On the positive photoresist film, a lattice-wise patterned photomask having light-screening window-shaped parts of one window-size of 60 μm×200 μm was set. The gap between the photomask and the photoresist film was 30 μm. Then, the resulting product was exposed to light at a light exposure of 100 mJ/$cm^2$ with Proximity Exposing Machine (MAP-1200, manufactured by Dainippon Kaken Co.). This procedure illustrates step (b) of the present invention.

(4) Development

After the exposure, the product of (3) was immersed in a developing solution (trade name: SOPD, manufactured by Sumitomo Chemical Co., Ltd.) for 60 seconds at 25° C. to eliminate and develop the exposed parts, and then rinsed with deionized water and air-dried. Thus, a positive photoresist film was formed at window parts of lattice. This procedure illustrates step (c) of the present invention.

(5) Heat-Treatment

The substrate obtained in (4) having the window-shaped positive photoresist film was heat-treated in an oven at 220° C. for one hour. This procedure illustrates step (d) of the present invention.

(6) Formation of Negative Photoresist Film

A coating material for black mask (negative photoresist, manufactured by Shinto-Chemitron Co.) was coated by the screen-printing method on the whole surface of the substrate obtained in (5). After the coating, the coating film was heat-treated at 100° C. for 10 minutes. The film thus formed had a thickness of about 8 μm. This procedure illustrates step (e) of the present invention.

(7) Exposure of Negative Photoresist Film to Light

The substrate obtained in (6) was exposed to UV light of 80 W from the opposite side of the conductive circuits-carrying surface at a distance of 10 cm for a period of 10 seconds. The light exposure was 1,800 mJ/$cm^2$. The main wavelengths of the UV light used herein were 313 nm and 365 nm. This procedure illustrates step (f) of the present invention.

(8) Development and Washing

The substrate obtained in (7) was then immersed in ethyl cellosolve acetate for 2 minutes, while applying ultrasonic wave thereto, whereby the coating film of the unexposed part [the parts obstructed from exposure due to the existence of light-screening positive photoresist film formed in (5)] was eliminated. Then, the resulting product was immersed in an ethyl cellosolve acetate washing liquor for 30 seconds, and thereafter immersed in isopropyl alcohol and deionized water successively each for a period of 30 seconds. Then, the resulting product was heated, and the remaining film were cured at 230° C. for 30 minutes.

As a result, a lattice-form, frame-shaped functional film (black matrix, film thickness: 1.2 µm) was formed. This procedure illustrates step (g) of the present invention.

(9) Elimination of Positive Photoresist Film

The transparent substrate obtained by the above-mentioned steps was immersed in 5% by weight aqueous solution of caustic soda heated to 40° C. for 15 minutes, and then the positive photoresist film on the substrate was brushed while showering deionized water to eliminate and peel off the positive photoresist film only. Then, the resulting product was thoroughly wash, air-dried and heat-treated at 200° C. for 30 minutes. This procedure illustrates step (h) of the present invention.

(10) Formation of Electro-Deposited Film

Using prescribed transparent conductive circuits on the transparent substrate as one electrode, electro-deposition was carried out in order of red, green and blue coatings. As the electro-deposition coating materials, aqueous solutions of an anionic polyester resin containing a red pigment (azo metallic salt type red pigment), a green pigment (Phthalocyanine Green) and a blue pigment (Phthalocyanine Blue), respectively, in the state of dispersion [trade name Shintron F-Red-C (red), trade name Shintron F-Green-C (green), and trade name Shintron F-Blue-C (blue), all manufactured by Shinto-Chemitron Co.] were used. The electro-deposition was carried out at 50–80 V for a period of 10–20 seconds, which conditions were varied depending on the color. Then, the resulting electro-deposited films were thoroughly washed with water and heat-treated at 260° C. for one hour.

As a result, red-, green- and blue-colored films each having a thickness of 1.2 µm were formed in the prescribed order in the window-shaped parts where no positive photoresist film was formed. This procedure illustrates step (e) of the present invention.

FIG. 2 shows the pattern of the thus obtained window-shaped, color films and the lattice-form, frame-shaped functional film.

Observation of the product obtained herein by means of an optical microscope (trade name OPTIPHOT-88, manufactured by NIKON CORP.) at a magnification of 200 revealed that no leakage of light was noticeable between the window-shaped color films and the lattice-form, frame-shaped functional coating film, and the films were all formed with a high precision.

According to the method of the present invention, there can be formed, on a transparent substrate having a plurality of electrically conductive circuits on a surface thereof, window-shaped, coating films located on the electrically conductive circuits and a frame-shaped, coating film having light-screening properties or other desirable functions at the regions not occupied with the window-shaped coating films with high precision. Particularly, a coating film with fine patterns in which each window-shaped part has a width of less than about 200 µm can be formed with high precision. Thus, the method of the present invention is suitable for producing, for example, a color filter for use in LCD well prevented from the leakage of light, excellent in clearance of color parts and quite excellent in optical properties, and particularly suitable for producing the color filters used in matrix type color display using TFT and color filters.

What is claimed is:

1. A method for manufacturing a substrate having electrically conductive circuits on the surface of a transparent substrate, window-shaped colored coating films on the electrically conductive circuits and a frame-shaped functional coating film at the regions not occupied with the window-shaped colored coating films, which comprises the steps of:

(a) coating a transparent substrate having electrically conductive circuits on the surface thereof with a positive or negative photoresist composition to cover the whole circuits-carrying surface of the substrate, followed by forming a photoresist coating film, (b) superposing, on the surface of the photoresist coating film formed through step (a), a photomask having a pattern designed so as to eliminate the photoresist coating film in the frame-shaped part in the following step (c), and exposing the thus masked photoresist coating film to light, (c) subjecting the substrate formed through steps (a) and (b) to development, and eliminating the photoresist coating film in the frame-shaped part, (d) subjecting the photoresist coating film left in step (c) to heat-treatment, (e) coating the substrate obtained through steps (a) to (d) in this order with a negative photoresist composition containing a function-imparting additive to cover the whole circuits-carrying surface of the substrate, following by forming a functional coating film, (f) exposing the substrate obtained through steps (a) to (e) in this order to light emitted from the opposite side of the circuits-carrying surface of the substrate, (g) subjecting the substrate obtained through steps (a) to (f) in this order to development, and eliminating only the uncured part of the functional coating film which has not been sufficiently exposed to light due to the presence of the photoresist coating film having been heat-treated in step (d), (h) eliminating only the photoresist coating film having been heat-treated in step (d), and (i) subjecting the substrate obtained through steps (a) to (h) in this order to electro-deposition using the circuits on the substrate as one electrode, and forming electro-deposition coating films at the window-shaped parts on the circuits.

2. A method according to claim 1, wherein the formation of the photoresist coating film in step (a) is carried out by heat-treatment at 60° to 100° C. for 5 to 60 minutes.

3. A method according to claim 1, wherein the exposure to light in step (b) is carried out at a light exposure of 10 to 500 mJ/cm$^2$.

4. A method according to claim 1, wherein the development in step (c) is carried out using a developing agent selected from the group consisting of aqueous alkaline solution of caustic soda, sodium carbonate, quaternary ammonium salts; organic amines, and organic solvents.

5. A method according to claim 1, wherein the heat-treatment in step (d) is carried out at 120° to 300° C. for 15 minutes to 2 hours.

6. A method according to claim 1, wherein the formation of the functional coating film in step (e) is carried out by heat-treatment at 60° to 120° C. for 1 to 30 minutes.

7. A method according to claim 1, wherein the function-imparting additive contained in the negative photoresist composition used in step (e) is at least one member selected from light-screening pigments.

8. A method according to claim 1, wherein the exposure to light in step (f) is carried out using an ultraviolet ray at a light exposure of 100 to 2000 mJ/cm$^2$.

9. A method according to claim 1, wherein the elimination of the uncured functional coating film in step (g) is carried out using a developing agent selected from the group consisting of aqueous alkaline solutions of caustic soda, sodium carbonate, quaternary ammonium salts; organic amines, and organic solvents.

10. A method according to claim 1, wherein the elimination of the photoresist coating film in step (h) is carried out using a stripping agent selected from the group consisting of aqueous alkaline solution of caustic soda, sodium carbonate, quaternary ammonium salts; organic amines, and organic solvents.

11. A method according to claim 1, wherein the electro-deposition in step (i) is carried out by applying a direct current voltage of 10 to 300 V for about 1 second to about 3 minutes.

12. A method according to claim 1, wherein the electro-deposition coating film is a colored coating film and the functional coating film has a function as a black matrix of color filter.

13. A method for manufacturing a color filter for use in a liquid crystal display, which comprises the steps of:

forming the substrate having the functional film and the electro-deposition coating films by the method of claim 1, and forming a transparent conductive film on the functional film and the electro-deposition coating films directly or through an overcoat film formed on the functional film and the electro-deposition coating films.

* * * * *